US009508885B1

(12) United States Patent
Li et al.

(10) Patent No.: US 9,508,885 B1
(45) Date of Patent: Nov. 29, 2016

(54) GRAPHENE FIELD EFFECT TRANSISTOR FOR RADIATION DETECTION

(71) Applicant: The United States of America, as represented by the Administrator of the National Aeronautics and Space Administration, Washington, DC (US)

(72) Inventors: Mary J. Li, Bethesda, MD (US); Zhihong Chen, Lafayette, IN (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 14/843,697

(22) Filed: Sep. 2, 2015

(51) Int. Cl.
*G01N 27/403* (2006.01)
*H01L 31/119* (2006.01)
*H01L 31/028* (2006.01)

(52) U.S. Cl.
CPC ........... *H01L 31/119* (2013.01); *H01L 31/028* (2013.01)

(58) Field of Classification Search
CPC .......................... G01N 27/414; G01N 27/12
USPC .................................................. 257/253, 254
See application file for complete search history.

(56) References Cited

U.S. PATENT DOCUMENTS

| 9,196,766 B1 * | 11/2015 | Egerton | ................ H01L 31/028 |
| 2015/0137075 A1 * | 5/2015 | Heo | ..................... H01L 27/0922 257/29 |
| 2015/0228859 A1 * | 8/2015 | Morreale | ............ H01L 51/5296 257/29 |

* cited by examiner

Primary Examiner — Tan N Tran (57) ABSTRACT

The present invention relates to a graphene field effect transistor-based radiation sensor for use in a variety of radiation detection applications, including manned spaceflight missions. The sensing mechanism of the radiation sensor is based on the high sensitivity of graphene in the local change of electric field that can result from the interaction of ionizing radiation with a gated undoped silicon absorber serving as the supporting substrate in the graphene field effect transistor. The radiation sensor has low power and high sensitivity, a flexible structure, and a wide temperature range, and can be used in a variety of applications, particularly in space missions for human exploration.

13 Claims, 8 Drawing Sheets

GRAPHENE FIELD EFFECT TRANSISTOR FOR RADIATION DETECTION

BACKGROUND OF THE INVENTION

1. Field of the Invention

The present invention relates to a graphene field effect transistor-based radiation sensor (GFET-RS), which can be used in a variety of radiation detection applications.

2. Description of the Related Art

Space radiation includes not only photons, but also charged particles, ionized atoms and electrons. As they penetrate material they create a path of ionized matter, knocking electrons off of atoms they pass near thereto. This happens in any material, solid metal, insulator, semiconductor, and even in human DNA. These radiation effects can damage human cells, causing radiation sickness, leading to future health problems such as cataracts, cancer, vision impairment, and damage to the central nervous system. Since astronauts spend many months in space, it is difficult to predict the long-term effects of space radiation on the human body, and thus, radiation sensors which can detect ionizing radiation in small amounts, and which are portable and light-weight, and which can be useful in space missions, are desired.

In addition to detecting radiation affecting humans in space, it is also a requirement that the detrimental effects of radiation on equipment in space are closely monitored. For example, small, light-weight radiation sensors could be used in arrays of cubesats in Earth orbit, or even used in small satellites spread through the heliosphere which can be used as arrays of space weather stations to predict space weather. Thus, the detrimental effects of radiation on these satellites in order to prevent equipment damage and lose capability, is desired.

Current radiation sensor technologies are mostly based on rigid materials such as silicon or geranium, which do not have the flexibility which would be useful in a variety of applications in space where curved features exist, such as the human body.

Thus, finding radiation sensors which are portable, highly-sensitive, flexible, and can perform multi-purpose functions, and which can be carried by astronauts in space missions or used in equipment in space without being susceptible to radiation damage, are desired.

SUMMARY OF THE INVENTION

The present invention relates to a graphene field effect transistor-based radiation sensor (GFET-RS) for use in a variety of radiation detection applications, including manned spaceflight missions. The sensing mechanism of the GFET-RS is based on the high sensitivity of graphene in the local change of electric field that can result from the interaction of ionizing radiation with a gated undoped absorber serving as the supporting substrate in the graphene field effect transistor. The GFET-RS should have low power and high sensitivity, a flexible structure, and a wide temperature range. The GFET-RS of the present invention can be used in a variety of applications, particularly in space missions, and in equipment used in space, such as small satellites including cubesats.

In one embodiment, the present invention includes a radiation sensor, including: a silicon substrate with a silicon oxide layer disposed thereon; a layer of graphene disposed on the silicon oxide layer; and a source contact and a drain contact disposed on the silicon substrate.

In one embodiment, the graphene is made using an exfoliation process.

In one embodiment, the graphene is one of a graphene flake or a graphene ribbon channel.

In one embodiment, the substrate is flexible, and the graphene disposed on the flexible substrate can be physically manipulated including folding or rolling into arbitrary shapes.

In one embodiment, the substrate is an undoped silicon substrate which is used as a gate electrode and radiation absorber.

In one embodiment, the source contact and the drain contact are made from Pd/Au or Ti/Pd/Au.

In one embodiment, the source contact and the drain contact are defined by photo-beam lithography or e-beam lithography during fabrication.

In one embodiment, the graphene is patterned by e-beam lithography followed by reactive ion etching to form a desired length and width.

In one embodiment, the graphene reacts to a local change of electric field in an interaction between applied ionizing radiation on the undoped silicon substrate, by changing a voltage or resistance of the graphene, allowing the ionizing radiation to be sensed.

In one embodiment, an electric field is applied between the graphene ribbon channel and the undoped silicon substrate, and ionized charges are attracted to a location directly under the graphene, to enhance sensitivity of measurement of radiation energy deposited in the undoped silicon substrate.

In one embodiment, the ionizing radiation is gamma radiation, x-ray radiation, charge particle radiation, and heavy ion radiation.

In one embodiment, the sensor is used in space applications.

In one embodiment, the graphene is stable in a temperature range from 4° C.-2800° C.

In one embodiment, an integrated circuit package includes the radiation sensor.

Thus has been outlined, some features consistent with the present invention in order that the detailed description thereof that follows may be better understood, and in order that the present contribution to the art may be better appreciated. There are, of course, additional features consistent with the present invention that will be described below and which will form the subject matter of the claims appended hereto.

In this respect, before explaining at least one embodiment consistent with the present invention in detail, it is to be understood that the invention is not limited in its application to the details of construction and to the arrangements of the components set forth in the following description or illustrated in the drawings. Methods and apparatuses consistent with the present invention are capable of other embodiments and of being practiced and carried out in various ways. Also, it is to be understood that the phraseology and terminology employed herein, as well as the abstract included below, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent construc-

DESCRIPTION OF THE INVENTION

The present invention relates to a graphene field effect transistor (GFET) based radiation sensor (RS) for a variety of radiation detection requirements, including manned spaceflight missions.

The ability of graphene field effect transistors to detect electromagnetic radiation, such as X-rays, gamma rays, and photons, has been demonstrated in current scientific literature. In all of these detections, a semiconductor substrate is used as a radiation absorber for charge collection and a large area graphene flake channel (see FIG. 1C, for example) acts as a sensor to detect the ionization produced by the absorbed radiation.

In the present invention, the graphene field effect transistor (FET) based radiation sensor (RS) detects radiation by sensing electrical field changes produced by the radiation-generated charged particles in the absorber. The resulting changes in the graphene resistance are particularly large near the "Dirac point" of the sharp peak in resistance as a function of electric field. This is intrinsically faster than the method used by standard semiconductors where drifted or collected charges are sensed. Since graphene acts as the radiation detector while the substrate serves as the charge absorber in the radiation sensor of the present invention, more flexibility is allowed in the choice of the substrate material and the thickness of the substrate to meet the needs of various applications.

In current device fabrication processes, graphene is grown using the exfoliation process. In the exfoliation-based approach, graphene films are produced by exfoliating graphene flakes from Highly Oriented Pyrolitic Graphite (HOPG) crystals. The graphene flakes vary widely in size and thickness, from nanometers to micrometers. Subsequent to the graphene flakes being peeled off the graphite crystals, multiple-layer graphene remains on the tape. The repeated peeling of the multiple-layer graphene cleaves the graphene into various small flakes of exfoliated graphene of only a few layers. Then, the tape is attached to a silicon dioxide/silicon ($SiO_2$/Si) substrate and the last peeling of the tape from the substrate is performed to obtain single layer graphene. The quality of the graphene obtained is very high, with almost no defects.

In one embodiment, an atomic-layer-thick graphene 101 can be attached to flexible substrates or materials like polymers. Thus, in the graphene based radiation sensor of the present invention, the graphene with substrate can be physically manipulated, such as folded, rolled or crumpled up, without damaging the radiation sensor, which opens wide application possibilities. Further, the GFET-RS of the present invention can be made into arbitrary shapes like cloths, head bands, and knee pads. This advantage will benefit not only astronauts in space missions, but also any personnel who need to be monitored and protected from radiation.

Figure 1A:
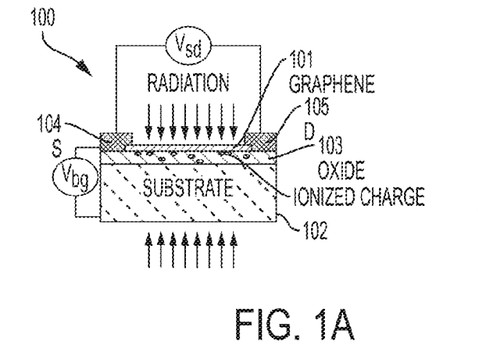
FIG. 1A shows a side view of a graphene field effect transistor (GFET) based radiation sensor (RS), according to one embodiment consistent with the present invention.
Figure 1B:
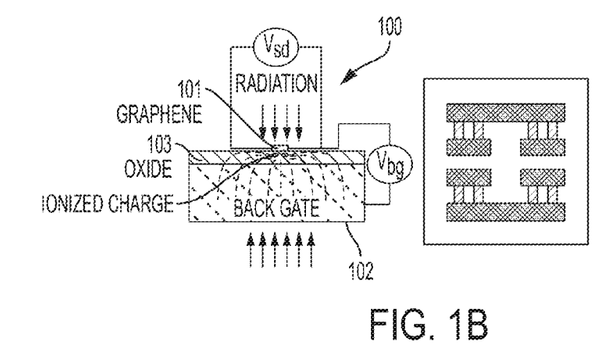
FIG. 1B shows a side view of a graphene nano-ribbon field effect transistor (GFET) based radiation sensor (RS), according to one embodiment consistent with the present invention. The right hand figure shows a layout of an array of the ribbon devices being electrically contacted together for large area, high sensitivity radiation detection.
Figure 1C:
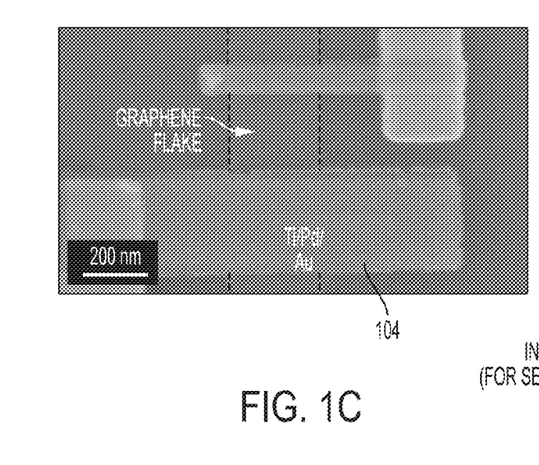
FIG. 1C shows a top microscopic view using a scanning electron microscope of a GFET-RS device according to one embodiment consistent with the present invention.

In one embodiment, as shown in FIGS. 1A-1B, the field effect transistor (FET) radiation sensor (RS) 100 of the present invention includes a one-atomic layer thick exfoliated graphene 101 that was deposited on a silicon (Si) substrate 102, with a silicon dioxide ($SiO_2$) substrate 103 thereon (i.e., approximately 90 nm), with metal pads as source 104, gate 105 for the FET radiation sensor 100. In one embodiment, the Si substrate 102 is undoped and is used as the gate electrode and radiation absorber. In one embodiment, the graphene layer 101 is deposited on the Si substrate 102 with a certain thickness as an insulation layer. In one embodiment, the one-atomic layer thickness of graphene 101 in the FET radiation sensor 100 of the present invention, makes every carbon atom in graphene 101 exposed, which gives graphene 101 the highest surface area possible for radiation sensing.

Figure 1D:
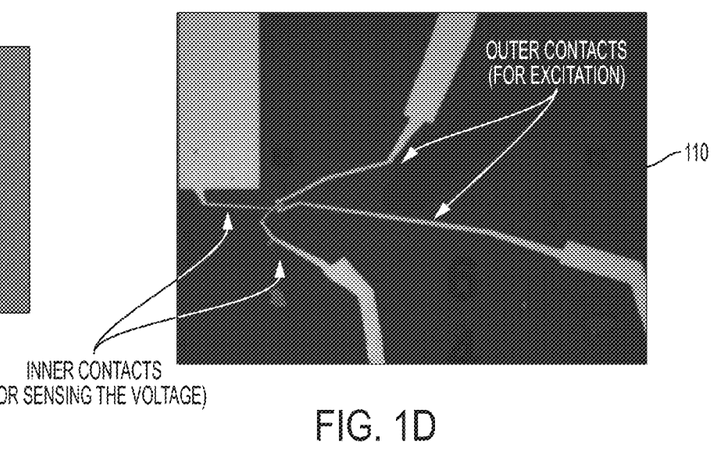
FIG. 1D shows a top microscopic view of a GFET-RS device showing the contacts, according to one embodiment consistent with the present invention.

In one embodiment, the metal pads 104, 105 are made from lead/gold (Pd/Au) or titanium/lead/gold (Ti/Pd/Au) (see FIG. 1C), for example, and are source 104, drain/gate 105 contacts used for electrical connection. The metal pads or contacts 104, 105 allow electrical characterization of the device 100. Thus, the graphene 101 bridges the source 104 and the drain 105, and the source 104 and drain 105 are connected externally through wire bonding (see FIG. 1D).

In one embodiment, the metal pad contacts for the source 104 and drain 105 are defined on top by photo- and e-beam lithography during fabrication. In one embodiment, the graphene 101 is patterned by e-beam lithography followed by reactive ion etch to form the desired length and width. The produced graphene 101 and graphene composites may be characterized using a Scanning Electron Microscope (SEM), Scanning Tunneling Microscope (STM), Atomic Force Microscope (AFM), and Raman Spectroscope.

In one embodiment, the GFET radiation sensor 100 of the present invention was packaged in an integrated circuit packaging 110 (see FIG. 1D), or pin grid array (PGA), with the pins wire boded and soldered. In one embodiment, arrays of GFET radiation sensors 100 are manufactured for large area radiation detection.

In operation, the sensing mechanism of the GFET radiation sensor 100 of the present invention is based on the high sensitivity of graphene 101 to the local change of electric field that can result from the interaction of ionizing radiation with a gated undoped absorber serving as the supporting substrate (Si) 102 in the radiation sensor 100. This sensitivity by graphene 101 makes the radiation sensor 100 respond very fast, such that as soon as photons from the applied radiation (i.e., gamma, x-ray, charged particle) are received by the sensor 100, the silicon oxide 103 and silicon substrate 102 catch the signals, and the voltage or resistance on graphene 101 changes—allowing the radiation to be sensed (see FIGS. 1A-1B).

Since graphene 101 is sensitive to radiation induced gate field changes and at the same time is radiation hardened, a long life, highly sensitive and reliable radiation sensor 100 using graphene-based FETs can be built. In one embodiment, the GFET-RS 100 of the present invention was tested for radiation by the application of constant radiation, and the sensor conductance was measured before and after the radiation. An increase was observed in the device mobility (transconductance) after the radiation. In one embodiment, 30 RPM radiation was sufficient to change the conductance of the Si substrate 102. However, radiation induced changes were more dominant in a less conductive substrate. Thus, to further increase the sensitivity, the present undoped Si substrate 102 was used. However, other absorbing substrates with the same characteristics may be used.

In one embodiment, arrays of graphene nano-ribbon channels (see FIG. 1C) were also used in conjunction with undoped substrates 102 to enhance the sensitivity of measuring the energy of the radiation deposited in the absorbers 102. By applying an electric field between the electrically biased substrate 102 electrode and the graphene channel 101, an intense field is formed around the narrow graphene ribbons which efficiently attracted ionized charges to the location directly under the graphene before the recombination process occurs. Better energy resolution was obtained since the measured signals were much less dependent on the location of the photon interaction in the absorber 102.

Thus, the sensing mechanism of the GFET-RS 100 is based on the high sensitivity of graphene 100 in the local change of electric field that can result from the interaction of ionizing radiation with a gated undoped absorber 102 serving as the supporting substrate in the graphene field effect transistor.

Accordingly, the graphene field effect transistor based radiation sensor (GFET-RS) 100 of the present invention is a multi-purpose radiation detector with the advantages of high energy resolution, long life time, low power, high reliability and repeatability, high thermal stability, high design flexibility, and low cost. The GFET RS 100 of the present invention has a flexible structure and a wide temperature range which is useful in space applications, especially for small satellites, such as cubesats. The high transconductance of the GFET radiation sensors 100 of the present invention, allows the sensors 100 to sense radiation in space, which is highly advantageous. The GFET radiation sensors 100 of the present invention differ from conventional charge-sensing detectors as the sensors 100 utilize the sensitive dependence of graphene conductance on local change of the electric field which can be induced by interaction of radiation with the underlying absorber substrate 102.

Radiation testing was performed on the GFET radiation sensor 100 of the present invention, to determine performance (sensitivity) of the graphene to radiation, as well as to determine whether the graphene would be damaged by radiation. Thus, the radiation testing was performed at a different dose rate and dosage of radiation, to ascertain graphene's resistance to radiation and how fast it recovers after radiation is sensed. The radiation testing included subjecting the GFET radiation sensor 100 to gamma ray radiation, x-ray radiation, and charged particle radiation (electrons/protons), and heavy ions (Argon).

Figure 2A:
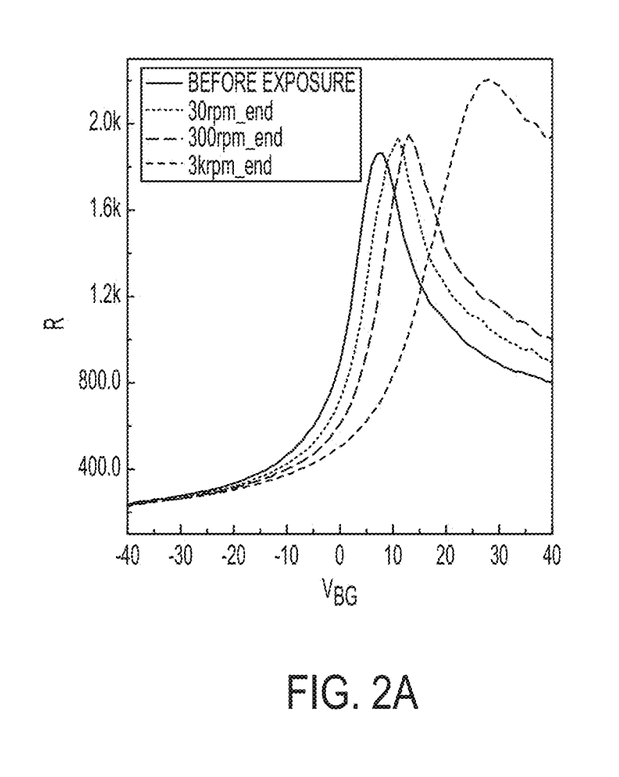
FIG. 2A shows gamma radiation responses of the GFET-RS device according to one embodiment consistent with the present invention.
Figure 2B:
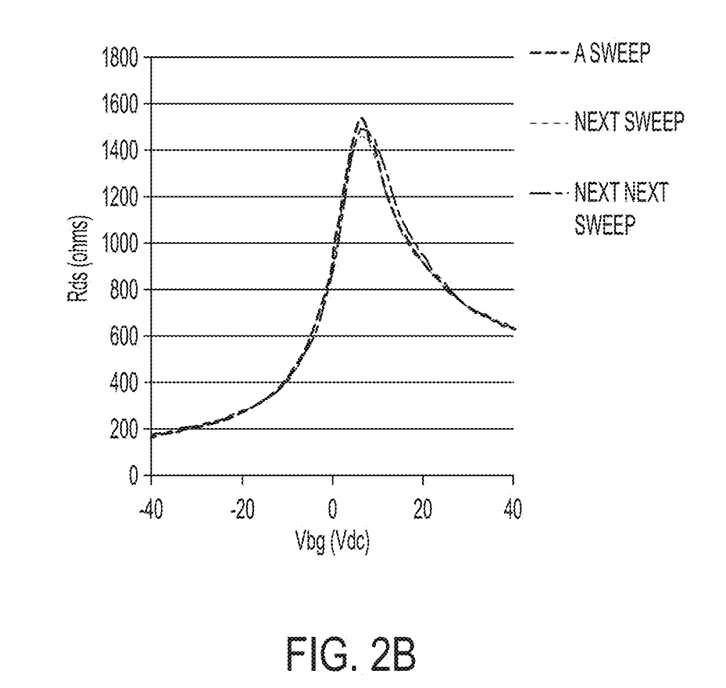
FIG. 2B shows gamma radiation responses of the GFET-RS device, post-anneal resistance, according to one embodiment consistent with the present invention. A complete recovery of the device resistance after annealing is evident.

In one exemplary test, gamma radiation was applied to the graphene FET radiation sensor 100 of the present invention, in its PGA package, at 35, 291, and 3080 Rad/min dose rates, respectively, and a total dose of 225.6 Krad (see FIGS. 2A-2B). The graphed results show that the sensor 100 was responsive at those dose rates. Thereafter, the sensor 100 was annealed at 150° C. in a vacuum ($\times 10^{-6}$ torr) overnight, and electrical characterization was performed thereon, with results showing that the sensor 100 was fully recovered after the annealing, as shown in FIG. 2B.

Figure 3:
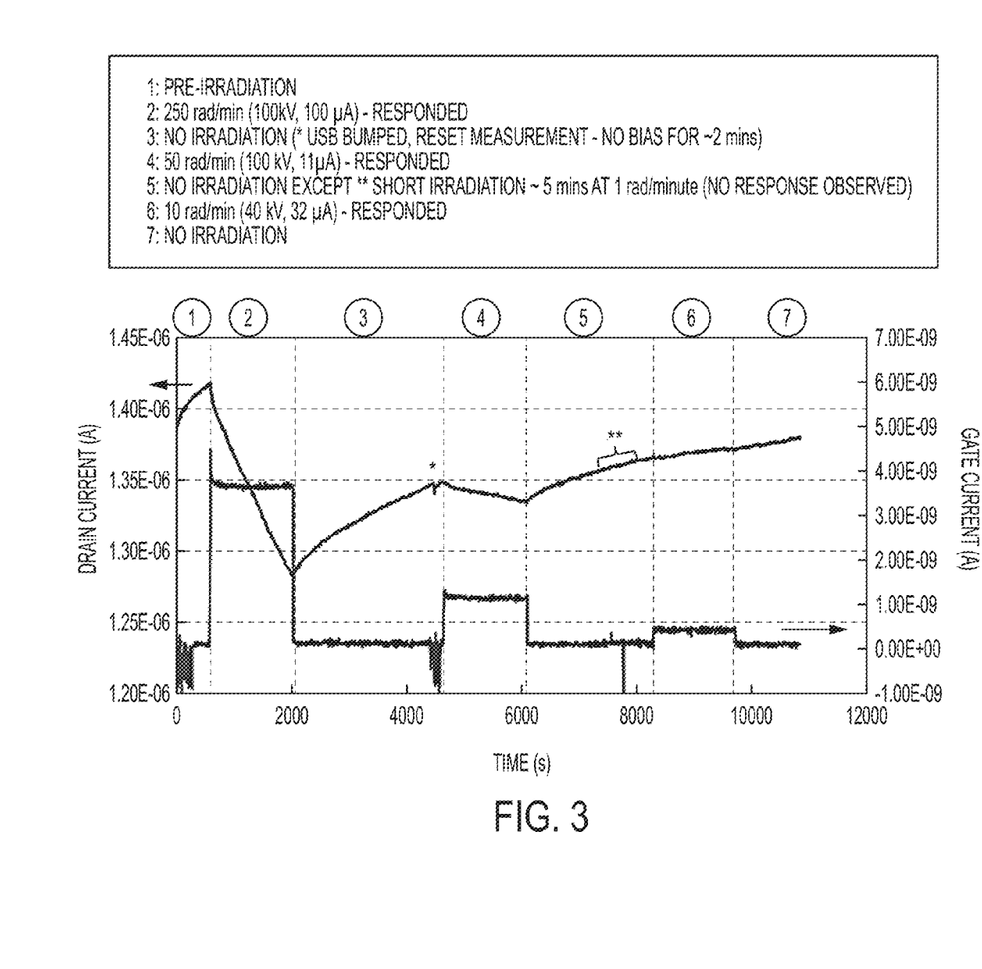
FIG. 3 shows X-ray radiation responses of the GFET-RS device under various exposure conditions, according to one embodiment consistent with the present invention.

In another exemplary test, x-ray radiation was applied to the graphene FET radiation sensor 100 of the present invention, using an x-ray source, such as the Phoenix MicromeX. A single voltage bias of 9V was applied at a distance of 1.5 inches in air to the sensor 100. The results confirmed that the Dirac point was shifted up, and that the sensor 100 responded at 250, 50, and 10 rad/min. Further, FIG. 3 shows the same doses in graphs of drain current (A) vs. constant bias time (s). The graph shows how the voltage change can be detected with time, as the graphene senses radiation. The results show that the graphene in the sensor 100 senses radiation with a higher radiation dose 250 rad/min (100 kVm 100 μA) in Region 2. The sensor 100 responded as the dose was reduced to 50 rad/min (100 kV, 11 μA) in Region 4, and also responded as the dose was reduced to 10 rad/min (40 kV, 32 μA) in Region 6.

Figure 4A:
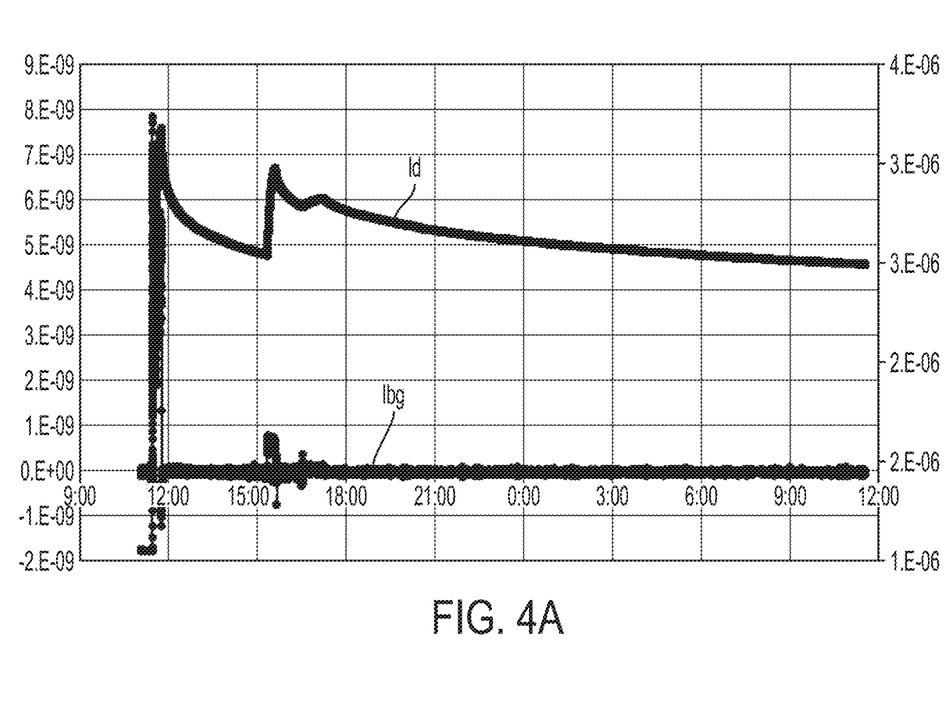
FIG. 4A is a graph showing charged particle radiation responses by the GFET-RS device, for electron radiation, according to one embodiment consistent with the present invention.
Figure 4B:
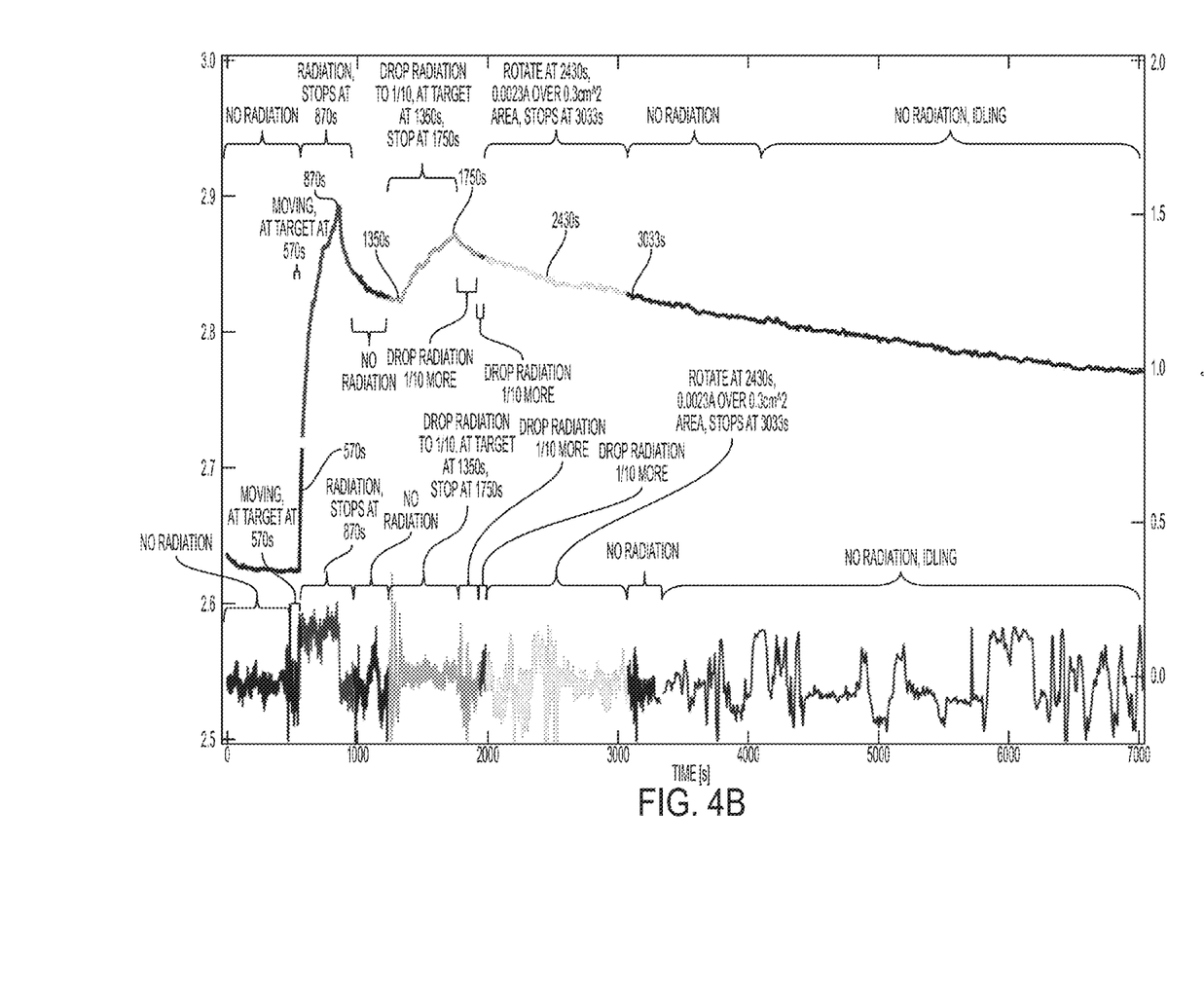
FIG. 4B is a graph showing charged particle radiation responses by the GFET-RS device, for proton radiation, according to one embodiment consistent with the present invention.

In another exemplary test, charged particle radiation was applied to the graphene FET radiation sensor 100 of the present invention using electrons and protons, respectively. A 1 Mev accelerator was used to test the sensor's 100 response. Single voltage bias of 15V was applied to the GFET-RS 100. For the electron radiation, as shown in the graph of FIG. 4A, the sensor 100 responded at 1.8E-9A, 0.25E-9A, 0.02E-9A, but not at 0.001E-9A when tested at the energy level of 500 Kev; and also responded at 9.0E-9A, 0.9E-9A, and 0.05E-9A when tested at the energy level of 250 Kev. For the proton radiation, the sensor 100 also responded at four current levels when tested at the energy level of 35 Kev (see FIG. 4B).

Figure 5A:
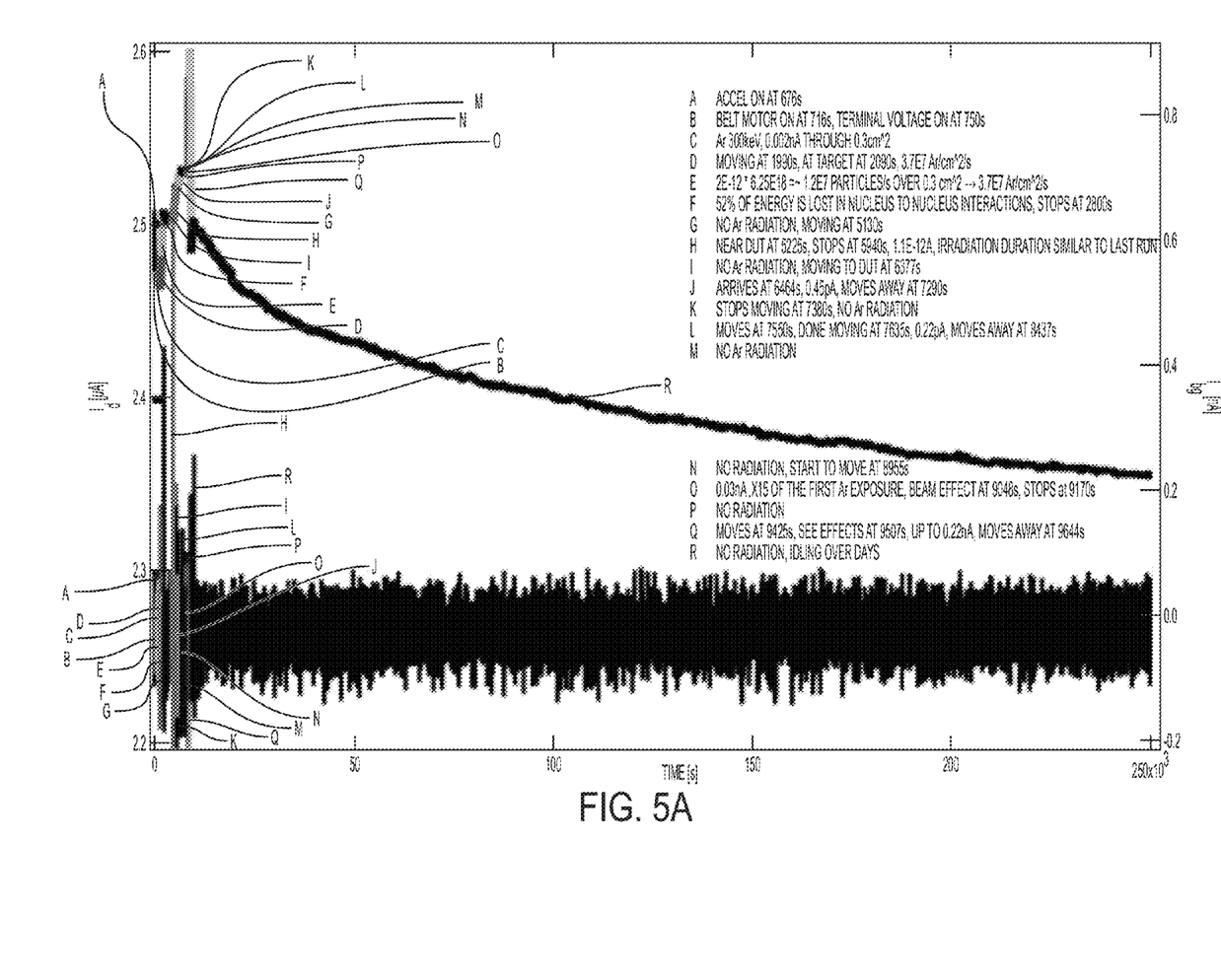
FIGS. 5A-5B are graphs showing Argon heavy ion radiation responses by the GFET-RS device, according to one embodiment consistent with the present invention.
Figure 5B:
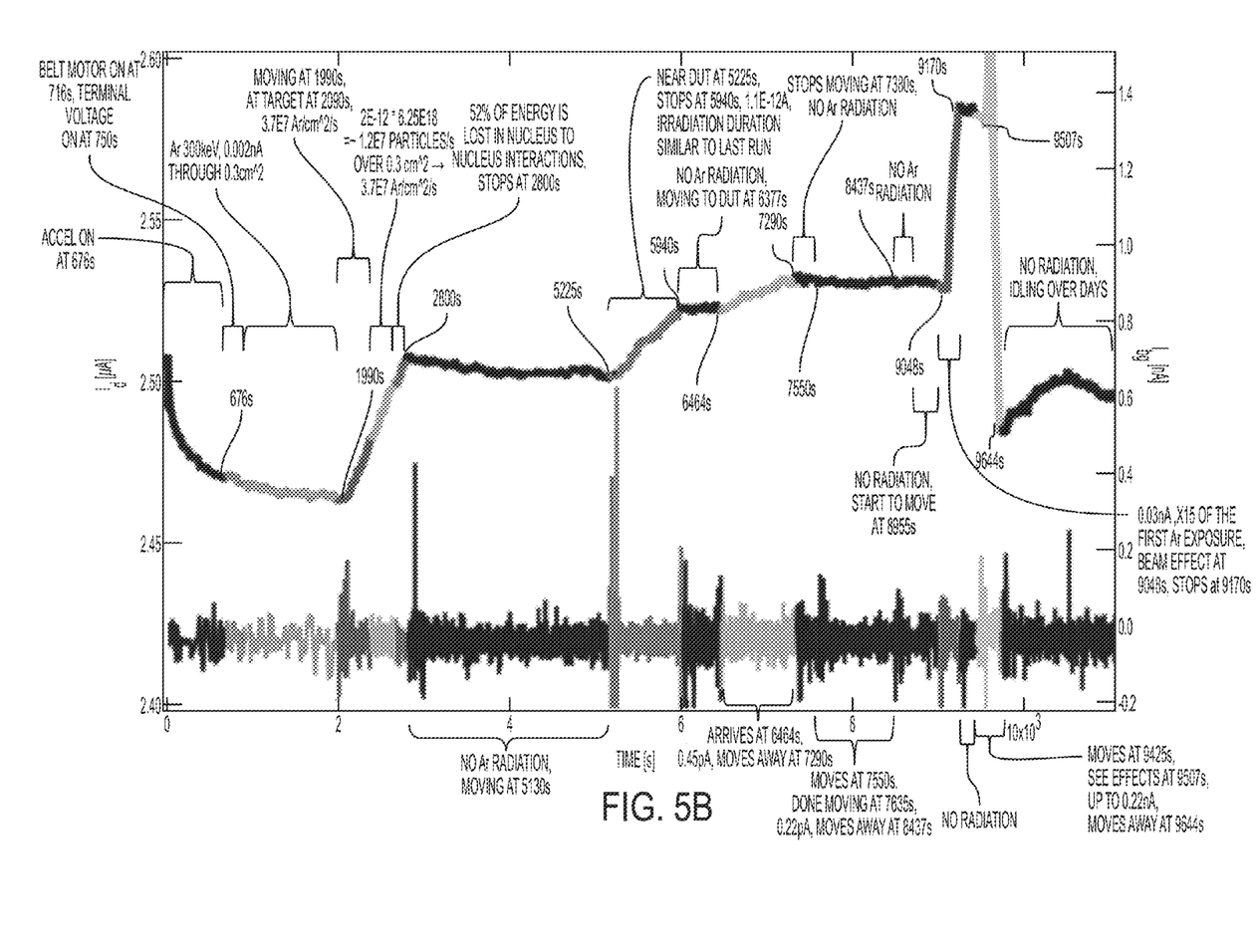
Figure 5C:
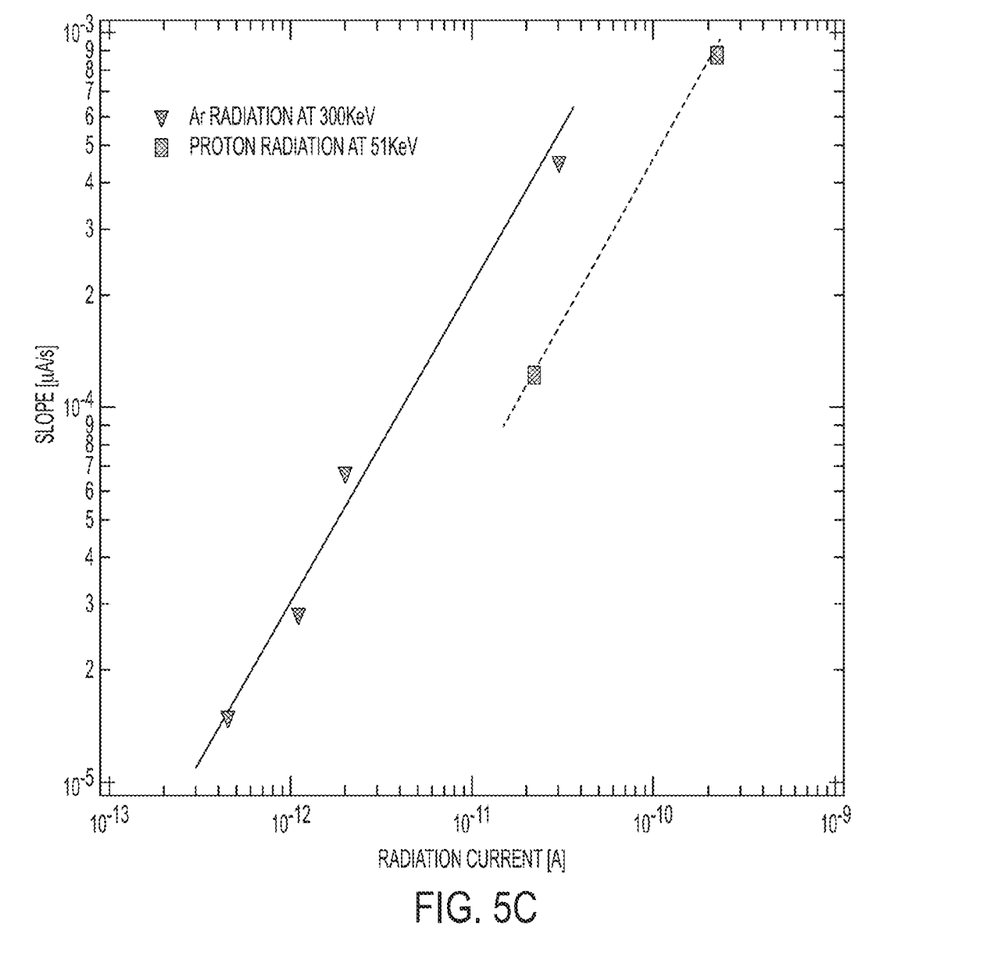
FIG. 5C compares the slopes of the current change in Argon and proton radiations as a function of the radiation current.

In another exemplary test, heavy ion radiation was applied to the graphene FET radiation sensor 100 of the present invention, under a single voltage bias of −15V, under vacuum, with the Dirac point shifted down. The applied energy was 300 Key, with an exposure window of 0.3 cm$^2$, and the response at various currents were noted: 2.0 pA, 1.1 pA, 0.22 pA, and 220 nA. In the results, the radiation definitely showed power law dependence of the slope on current, which showed the positive performance of the GFET-RS 100 (see FIGS. 5A-5C). Further, no Ibg change indicated that the Ar ions did not penetrate the silicon oxide 103 of the structure. Through calculations from number of Ar heavy ions applied on the 0.3 cm$^2$ area of graphene in the sensor 100, the results indicated the radiation sensor 100 of the present invention is sensitive enough to catch single radiation event.

In summary, the results of the testing on the behavior and function of dosage and dose rate on the GFET-RS 100 of the present invention, demonstrated that the radiation detector 100 is sensitive and radiation hard. The gamma radiation tests showed that the gamma radiation was found to interact with the absorbing substrate and increase its conductance. Since the graphene channel is being gated by the substrate 102 through a gate dielectric layer, the change in the substrate conductance leads to a change of electric field across the gate dielectric which in turn modifies the resistance of the graphene channel 101. The comparison of device characteristics before the radiation and after various radiation doses show that: 1) device mobility does not change very much even after large dose radiation exposure, indicating graphene is a radiation hardened material; and 2) device characteristics shift to positive gate voltages (X-axis) upon radiation, indicating the detection of radiation induced electric field change in the substrate.

Accordingly, the graphene FET radiation detector 100 of the present invention is sensitive and radiation-hard under exposure to high dosages and high rates of gamma radiation. The radiation sensor 100 of the present invention has low power and ultra-high sensitivity to gamma radiation, x-ray, charged particles, and heavy ions. In particular, low power (~μW) is achieved with the absorber substrate 102 and device layout in the GFET radiation sensor 100 of the present invention, compared with other technologies using ~mW of power, such as Radiation-sensing Field-Effect Transistors (RadFET) that have been used as space vehicle health monitors.

The high mechanical strength, highly flexible structure, extraordinary thermal sensitivity, and wide temperature range of graphene is advantageous in ionizing radiation sensors in space technology applications, such as in monitoring of astronauts health and safety, and in structures such as small satellites such as cubesats. High thermal stability has been proved in graphene in a temperature range up to 2800° C. and down to 4° K, and its FET characteristics are temperature insensitive. Unlike conventional silicon devices where low-temperature performance is hampered by carrier freeze-out effects, the GFET-RS 100 of the present invention has a much larger window of operation for space missions.

Further, the high energy resolution of the GFET-RS 100 is at least 10 times better than semiconductor dosimeters like germanium silicon PIN diode semiconductors, and cadmium zinc telluride (CZT) based radiation detectors used in present space applications. Due to ultra-low electronic noise in graphene based FETs, energy resolution degradation associated with noise is expected to be very small. The radiation sensor 100 of the present invention can detect random or low dose rate radiation and accurately measure the amount of deposited energy. The energy resolution is partially determined by the carrier number fluctuation during the ionization process. The unique graphene nano-ribbon channels used in conjunction with undoped substrates to enhance the sensitivity of measuring the energy of the radiation deposited in the absorbers also efficiently attracted ionized charges to the location directly under the graphene. Further, the fast carrier recombination rate contributes to energy resolution. Still further, the demonstrated ultra-low electronic noises in bilayer or multi-layer graphene radiation sensor 100 of the present invention, ensures ultra-fine energy resolution. Finally, the results of the sensor 100 responses from radiations in vacuum showed the device capability of catching a single radiation event, indicating its ultra-high sensitivity.

The GFET-RS 100 of the present invention provides the optimal design of a graphene channel to enhance detection sensitivity. High design flexibility and low cost is expected since graphene 101 senses the electric field changes while the underlying substrate 102 absorbs the radiation in the GFET-RS device 100. In other embodiments, more substrate materials can be utilized with various dimensions beneficial to the various types of radiation to be detected. In one embodiment, flexible substrates can be used to make GFET-RS 100 in patches for uneven surfaces. Further, high reliability and repeatability is achieved in the GFET radiation sensor 100 fabrication due to the lack of doping needed in the substrate 102, while conventional devices such as RadFETs can have fabrication repeatability issues related to oxide growth and MOSFET doping requirements.

The GFET radiation sensor 100 of the present invention has a long life time due to its radiation resistance. In contrast to Silicon Surface Barrier dosimeter devices (SSB) in which high radiation doses can cause oxidation in deep layers, the GFET radiation sensor 100 of the present invention has been shown to have improved characteristics after exposure to high-energy ions and gamma rays.

It should be emphasized that the above-described embodiments of the invention are merely possible examples of implementations set forth for a clear understanding of the principles of the invention. Variations and modifications may be made to the above-described embodiments of the invention without departing from the spirit and principles of the invention. All such modifications and variations are intended to be included herein within the scope of the invention and protected by the following claims.

What is claimed is:

1. A radiation hardened space based satellite in Earth orbit sensor, comprising:
   a silicon substrate with a silicon oxide layer disposed thereon;
   a layer of graphene comprising graphene flakes from highly oriented pyrolitic crystals including a one-atomic layer thick exfoliated graphene layer deposited on a silicon substrate, with a silicon dioxide substrate thereon of approximately 90 nm thickness, with metal pads as source and gate disposed on said silicon oxide layer further onto arrays of graphene nano-ribbon channels used in conjunction with undoped substrates enhancing the sensitivity of measuring energy of radiation deposited in an absorber with applying an electric field between an electrically biased substrate electrode and a graphene channel forming an intense field is around the graphene nano-ribbons with attracted ionized charges to a location directly under the layer of graphene before the recombination process occurs; and
   a source contact and a drain contact disposed on said silicon substrate.

2. The radiation sensor of claim 1, wherein said graphene is made using an exfoliation process.

3. The radiation sensor of claim 2, wherein said graphene is one of a graphene flake or a graphene ribbon channel.

4. The radiation sensor of claim 3, wherein said substrate is flexible, and said graphene disposed on said flexible substrate can be physically manipulated including folding or rolling into arbitrary shapes.

5. The radiation sensor of claim 3, wherein said substrate is an undoped silicon substrate which is used as a gate electrode and radiation absorber.

6. The radiation sensor of claim 5, wherein said graphene reacts to a local change of electric field in an interaction between applied ionizing radiation on said undoped silicon substrate, by changing a voltage or resistance of said graphene, allowing said ionizing radiation to be sensed.

7. The radiation sensor of claim 6, wherein said ionizing radiation is gamma radiation, x-ray radiation, charge particle radiation, and heavy ion radiation.

8. The radiation sensor of claim 5, wherein an electric field is applied between said graphene ribbon channel and said undoped silicon substrate, and ionized charges are attracted to a location directly under said graphene, to enhance sensitivity of measurement of radiation energy deposited in said undoped silicon substrate.

9. The radiation sensor of claim 2, wherein said graphene is patterned by e-beam lithography followed by reactive ion etching to form a desired length and width.

10. The radiation sensor of claim 1, wherein said source contact is made from one of a Pd/Au combination and a Ti/Pd/AU combination and said drain contact is made from one of a Pd/Au combination and a Ti/Pd/AU combination.

11. The radiation sensor of claim 1, wherein said source contact and said drain contact are defined by photo-beam lithography or e-beam lithography during fabrication.

12. The radiation sensor of claim 1, wherein said graphene is stable in a temperature range from 4° C.-2800° C.

13. An integrated circuit package comprising the radiation sensor of claim 1.

* * * * *